United States Patent
Moon et al.

(10) Patent No.: US 7,781,778 B2
(45) Date of Patent: Aug. 24, 2010

(54) SEMICONDUCTOR LIGHT EMITTING DEVICE AND METHOD OF MANUFACTURING THE SAME EMPLOYING NANOWIRES AND A PHOSPHOR FILM

(75) Inventors: Won Ha Moon, Gyunggi-do (KR);
Chang Hwan Choi, Gyunggi-do (KR);
Young Nam Hwang, Gyunggi-do (KR);
Hyun Jun Kim, Gyunggi-do (KR)

(73) Assignee: Samsung Electro-Mechanics Co., Ltd.

( * ) Notice: Subject to any disclaimer, the term of this patent is extended or adjusted under 35 U.S.C. 154(b) by 90 days.

(21) Appl. No.: 11/896,667

(22) Filed: Sep. 5, 2007

(65) Prior Publication Data
US 2008/0142823 A1    Jun. 19, 2008

(30) Foreign Application Priority Data
Dec. 15, 2006    (KR) .................. 10-2006-0129014

(51) Int. Cl.
*H01L 27/15* (2006.01)
*H01L 29/26* (2006.01)
*H01L 31/12* (2006.01)
*H01L 33/00* (2006.01)
*H01L 29/06* (2006.01)
*H01L 31/0328* (2006.01)
*H01L 31/0336* (2006.01)
*H01L 31/072* (2006.01)
*H01L 31/109* (2006.01)
*H01L 27/14* (2006.01)
*H01L 31/00* (2006.01)

(52) U.S. Cl. .................. 257/79; 257/13; 257/431; 977/700; 977/701; 977/720; 977/721; 977/762; 977/765; 977/932; 977/939

(58) Field of Classification Search ......... 977/700–701, 977/720–721, 762, 765, 932, 939; 257/13, 257/79, 431
See application file for complete search history.

(56) References Cited

U.S. PATENT DOCUMENTS 6,504,292 B1 *    1/2003    Choi et al. .................. 313/310

(Continued)

FOREIGN PATENT DOCUMENTS

JP    2005-063790    3/2005

(Continued)

OTHER PUBLICATIONS

Korean Office Action, with English Translation, issued in corresponding Korean Patent Application No. KR 10-2006-0129014, dated on Nov. 22, 2007.

(Continued)

*Primary Examiner*—Ida M Soward
(74) *Attorney, Agent, or Firm*—McDermott Will & Emery LLP

(57) ABSTRACT

There are provided a semiconductor light emitting device using a phosphor film formed on a nanowire structure and a method of manufacturing the device, the device including: a substrate; a light emitting structure including a first conductivity type semiconductor layer, an active layer and a second conductivity type semiconductor layer sequentially formed on the substrate; a plurality of nanowire structures formed on the light emitting structure and formed of a transparent material; and a phosphor film formed on at least an upper surface and a side surface of each of the plurality of nanowire structures.

7 Claims, 3 Drawing Sheets

U.S. PATENT DOCUMENTS

| | | | |
|---|---|---|---|
| 7,045,375 B1 | 5/2006 | Wu et al. | |
| 7,589,464 B2 * | 9/2009 | Conley et al. | 313/509 |
| 2005/0199894 A1 * | 9/2005 | Rinzler et al. | 257/94 |
| 2005/0208302 A1 * | 9/2005 | Yi et al. | 428/402 |
| 2006/0103307 A1 * | 5/2006 | Yan et al. | 313/582 |
| 2006/0189018 A1 * | 8/2006 | Yi et al. | 438/47 |
| 2006/0197436 A1 * | 9/2006 | Conley et al. | 313/498 |
| 2006/0249391 A1 * | 11/2006 | Jin | 205/118 |
| 2007/0111368 A1 * | 5/2007 | Zhang et al. | 438/99 |
| 2008/0176030 A1 * | 7/2008 | Fonash et al. | 428/119 |
| 2008/0210956 A1 * | 9/2008 | Kim | 257/88 |
| 2008/0315229 A1 * | 12/2008 | Yi et al. | 257/98 |

FOREIGN PATENT DOCUMENTS

| | | | |
|---|---|---|---|
| JP | 2006228722 A * | 8/2006 | |
| KR | 10-2005-0080207 | 8/2005 | |
| KR | 10-2006-0062636 | 6/2006 | |
| KR | 10-0593941 B1 | 6/2006 | |
| WO | WO 2006/097868 A2 | 9/2006 | |

OTHER PUBLICATIONS

Korean Office Action, with English Translation, issued in Korean Patent Application No. KR 10-2006-0129014, dated May 28, 2008.

* cited by examiner

SEMICONDUCTOR LIGHT EMITTING DEVICE AND METHOD OF MANUFACTURING THE SAME EMPLOYING NANOWIRES AND A PHOSPHOR FILM

CLAIM OF PRIORITY

This application claims the benefit of Korean Patent Application No. 2006-129014 filed on Dec. 15, 2006, in the Korean Intellectual Property Office, the disclosure of which is incorporated herein by reference.

BACKGROUND OF THE INVENTION

1. Field of the Invention

The present invention relates to a light emitting device and a method of manufacturing the same, and more particularly, to a light emitting device employing a combined structure of nanowires and a phosphor film to take advantage of properties thereof, and a method of manufacturing the same.

2. Description of the Related Art

In general, light emitting devices are readily miniaturized and have excellent light emission efficiency, and thus used as a light source for various display devices and optical communication devices. They are monochromatic in that they emit light of only a predetermined wavelength. Therefore, in order to achieve white light emission, two or more light emitting diodes are combined in one package or spherical phosphors are used to convert a portion of light of one of blue and ultraviolet light emitting diodes to produce white light. Generally, the latter is advantageous for miniaturization of a product, and thus actively employed.

However, since the spherical phosphors have a relatively large surface area and thus a high reactivity, there has been a need for the spherical phosphors to have improved stability and light emission characteristics. In addition, when a matrix of the phosphor contains impurities, the impurities may cause the light emission to take place in an unintended wavelength region, leading to degradation of light emission characteristics of the phosphor.

Recently, there have been attempts to apply nanostructures such as nanowires or nanorods to improving light efficiency, in which however the characteristics of the phosphor are not considered.

SUMMARY OF THE INVENTION

An aspect of the present invention provides a light emitting device having properties of both a phosphor film and a nanostructure by employing a phosphor film formed on a nanowire structure, and a method of manufacturing the same.

According to an aspect of the invention, there is provided a light emitting device including: a substrate; a light emitting structure including a first conductivity type semiconductor layer, an active layer and a second conductivity type semiconductor layer sequentially formed on the substrate; a plurality of nanowire structures formed on the light emitting structure and formed of a transparent material; and a phosphor film formed on at least an upper surface and a side surface of each of the plurality of nanowire structures.

According to another aspect of the invention, there is provided a method of manufacturing a light emitting device, the method including: forming a first conductivity type semiconductor layer, an active layer and a second conductivity type semiconductor layer on a substrate; forming a plurality of nanowire structures of a transparent material on the light emitting structure; and forming a phosphor film on at least an upper surface and a side surface of each of the plurality of nanowire structures.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
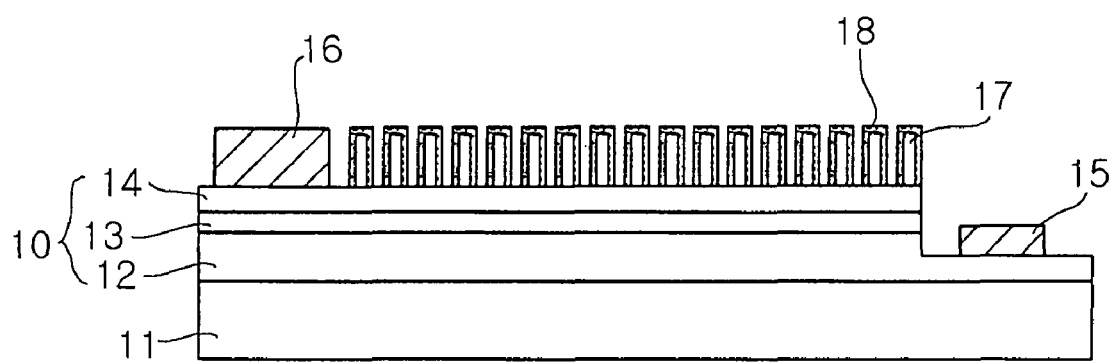
FIG. 1 is a side cross-sectional view illustrating a semiconductor light emitting device according to an exemplary embodiment of the present invention.

Exemplary embodiments of the present invention will now be described in detail with reference to the accompanying drawings. The invention may however be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals are used throughout to designate the same or similar components.

FIG. 1 is a side cross-sectional view illustrating a semiconductor light emitting device according to an exemplary embodiment of the present invention.

Referring to FIG. 1, the light emitting device includes a substrate 11, and a light emitting structure 10 having a first conductivity type semiconductor layer 12, an active layer 13 and a second conductivity type semiconductor layer 14 sequentially formed on the substrate. In addition, the semiconductor light emitting device includes a first electrode 15 connected to a portion of the first conductivity type semiconductor layer 12, the portion exposed by mesa etching, and a second electrode 16 connected to the second conductivity type semiconductor layer 14.

In addition, a plurality of nanowire structures 17 are formed on the light emitting structure 10. For reference, the plurality of nanowire structures 17 are formed in nanoscale, but are illustrated as enlarged in the drawing for convenience.

Figure 3:
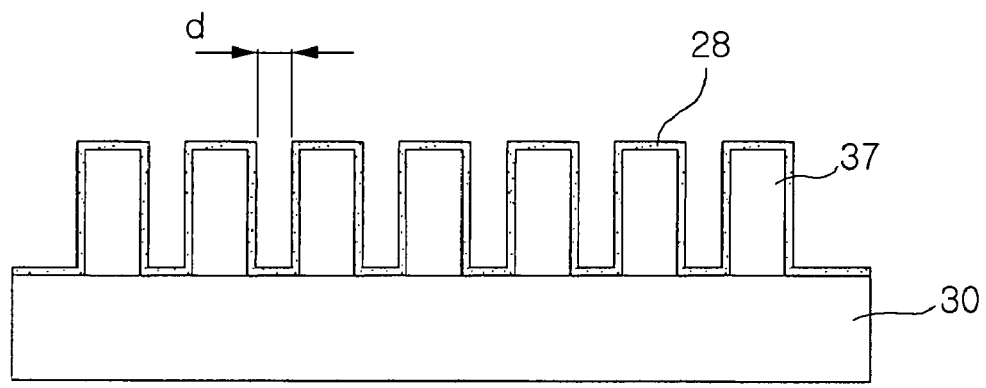
FIG. 3 is a cross-sectional view illustrating a phosphor film deposited on a nanostructure employable in another embodiment of the present invention.

In addition, a phosphor film 18 is formed on an upper surface of the light emitting structure 10, on which the plurality of nanowire structures 17 are formed. In this embodiment, the phosphor film 18 is formed on an upper surface and a side surface of each of the plurality of nanowire structures 17. If necessary, as shown in FIG. 3, a phosphor film may additionally be formed on upper surfaces of the light emitting structure 10 between the plurality of nanowire structures 17.

The plurality of nanowire structures 17 are formed of a transparent material in order not to interfere with light emission in a length direction thereof (upward direction in the drawing) and particularly, may be formed of a transparent conductive material. The transparent conductive material may be an oxide of at least one element of In, Sn, Zn, Ga, Cd, Mg, Be, Ag, Mo, V, Cu, Ir, Rh, Ru, W, Co, Ni, Mn and La. For example, the transparent conductive material may be one of ITO, ZnO, and $In_2O_3$ containing elements such as Cu, Zn and Mg. Of course, the nanowire structures are not limited to such and may be a compound semiconductor similar to a light emitting structure such as $Zn_xMg_{1-x}O$ ($0 \leq x \leq 1$) and $Al_xIn_yGa_{1-x}N$ ($0 \leq x, y \leq 1$).

The nanowire structures 17 may be formed by, but not limited to, forming a layer using the above-described conductive oxide into a film by a known layer forming process such as sputtering, electron beam evaporation and vacuum deposition and micro-patterning the layer using lithography. Alternatively, nano seeds may be formed, and then a conductive oxide may be selectively deposited on the seeds.

Although not shown in the drawing, an electrode having light transmittance may be formed on the second conductivity type semiconductor layer 14 under the nanowire structures 17. Such an additional electrode may be provided in a general layer structure, and may be formed of a generally known suitable material, in consideration of at least one of ohmic contact and current distribution.

As in this embodiment, the nanowire structures 17 may be formed in a light path to improve light extraction efficiency. Also, the phosphor film 18 may be applied on the nanowire structures 17 to solve the problem of degradation of light efficiency due to a waveguide effect of the general phosphor layer structure. Thereby, the light emitting device may provide advantages of both the phosphor film 18 formed along the nanostructure and the nanowire structures 17.

FIGS. 2A to 2D are diagrams illustrating a process of manufacturing a semiconductor light emitting device according to an embodiment of the present invention.

Figure 2A:
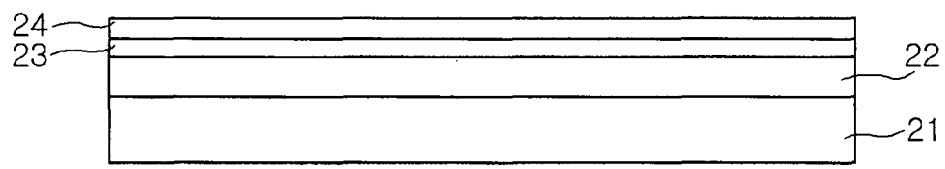
FIGS. 2A to 2D are views illustrating a process of manufacturing a light emitting device according to an exemplary embodiment of the present invention.

First, as shown in FIG. 2A, a first conductivity type semiconductor layer 22, an active layer 23 and a second conductivity type semiconductor layer 24 are sequentially formed on a substrate 21 to form a light emitting structure 20. The semiconductor layers employed in the embodiment may be nitride semiconductor layers.

Figure 2B:
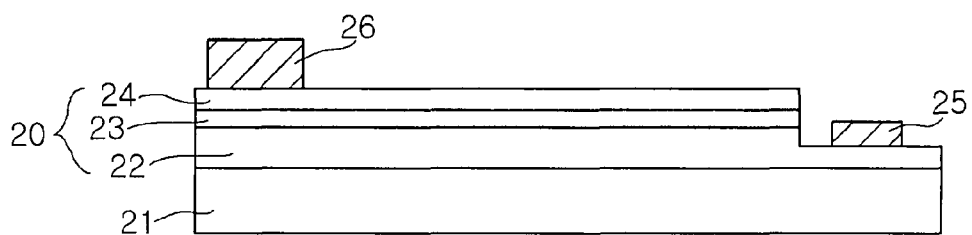

Next, as shown in FIG. 2B, a first electrode 25 is formed on a portion of the first conductivity type semiconductor layer 22, the portion exposed by mesa etching, and a second electrode 26 is formed on the second conductivity type semiconductor layer 24, respectively. An electrode layer (not shown) may be additionally formed on the second conductivity type semiconductor layer 24 before mesa-etching is performed.

Figure 2C:
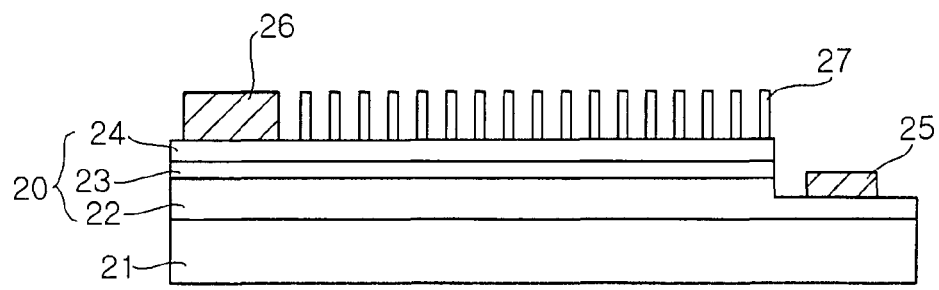

Next, as shown in FIG. 2C, a plurality of nanowire structures 27 formed of a transparent conductive material are formed on the light emitting structure 20. Each of the plurality of nanowire structures 27 may be formed of a transparent conductive oxide, for example, an oxide of at least one element of In, Sn, Zn, Ga, Cd, Mg, Be, Ag, Mo, V, Cu, Ir, Rh, Ru, W, Co, Ni, Mn and La. The oxide may be one of ITO, ZnO, and $In_2O_3$ containing elements such as Cu, Zn and Mg.

In addition, each of the plurality of nanowire structures 27 may be formed of one of $Zn_xMg_{1-x}O$ ($0 \leq x \leq 1$) and $Al_xIn_yGa_{1-x}N$ ($0 \leq x, y \leq 1$). For example, when a seed layer is formed of ZnO and ZnO is formed in an atmosphere with a greater amount of O than Zn, the ZnO may be grown into the plurality of nanowire structures. Such a principle may be applied to other materials constituting the nanowire structures.

As described above, the plurality of nanowire structures 27 may be formed by one of sputtering, physical vapor deposition (PVD) and chemical vapor deposition (CVD).

Figure 2D:
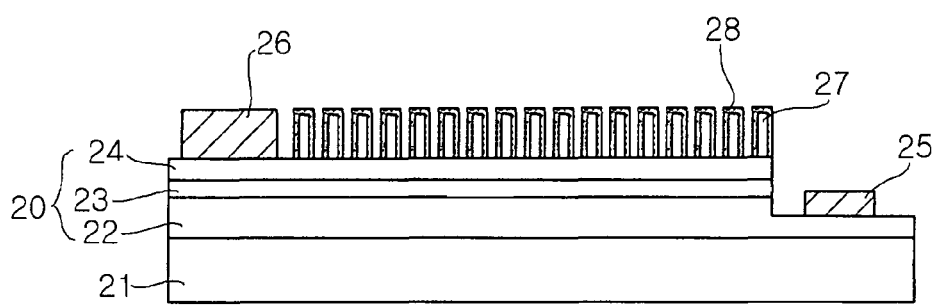

Finally, as shown in FIG. 2D, a phosphor film 28 is selectively deposited on at least an upper surface and a side surface of each of the plurality of nanowire structures 27.

FIG. 3 is a diagram illustrating a light emitting device with a phosphor film formed, according to another embodiment of the present invention, different from the embodiment of FIG. 1.

In FIG. 3, the phosphor film 38 is not only formed on an upper surface and a side surface of each nanowire structure but also on upper surfaces of a light emitting structure 30 between the nanowire structures 37. The plurality of nanowire structures may be formed at, but not limited to, an interval d of 2 to 100 nm.

When a phosphor film 28 is additionally formed on upper surfaces of the light emitting structure 30 between the nanowire structures 37 as in this embodiment, it is necessary that a suitable interval is provided between the nanowire structures to allow phosphor particles to reach a top surface of the light emitting structure 30 in the intervals between the nanowire structures. In this regard, the interval d between the nanowire structures 37 may be understood as being larger than the interval between the nanowire structures 17 in the embodiment shown in FIG. 1.

The specific examples of the phosphor employable in the present invention include a red phosphor such as CaS:Eu, ZnS:Sm, $Y_2O_2S$:Eu and $Gd_2O_3$:Eu, a green phosphor such as ZnS:Tb, ZnS:Ce, Cl, $Gd_2O_2S$:Tb, $SrGa_2S_4$:Eu and $Y_2SiO_5$:Tb, a blue phosphor such as SrS:Ce, ZnS:Tm and $YSiO_5$:Ce, a yellow phosphor such as YAG (Yittrium, Alumium, Garnet), and various mixtures of oxide and sulfur compound-based phosphor materials.

Figure 4:
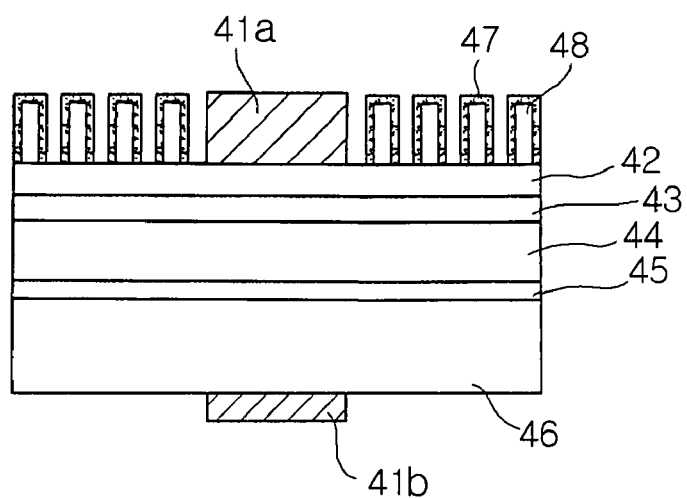
FIG. 4 is a side cross-sectional view illustrating a light emitting device according to anther embodiment of the present invention.

FIG. 4 is a side cross-sectional view illustrating a semiconductor light emitting device according to further another embodiment of the present invention. This embodiment shows that the present invention can be applied to a vertical structure, in which a light-transmitting substrate such as a sapphire substrate is separated from a light emitting structure by a process of a laser lift-off, lapping and the like.

Referring to FIG. 4, the light emitting device includes a light emitting structure having a first conductivity type semiconductor layer 42, an active layer 43 and a second conductivity type semiconductor layer 44 formed sequentially under a first electrode 41a, and a conductive substrate 46 and a second electrode 41b formed under the light emitting structure. In addition, a high reflectivity ohmic contact layer 45 may be added between the conductive substrate 46 and the light emitting structure. A plurality of nanowires 48 are formed on upper surfaces of the first conductivity type semiconductor layer 42 around the first electrode 41a, and a phosphor film 47 is selectively deposited on an upper surface and a side surface of each of the plurality of nanowires 48.

As described above, in the vertical structure light emitting device, the nanowire structures 48 and the phosphor film 47 may be formed on a surface of the light emitting device in a light path, thereby preventing degradation of light extraction efficiency and light efficiency due to the phosphor. The nanowire structure and the phosphor film in this embodiment may be understood as also employing the features described in the embodiments described above.

As described above, a phosphor film is deposited on nanowire structures to provide physical, chemical and mechanical properties different from those of the conventional phosphor layer. That is, in the present invention, a planar light extraction interface is improved by forming nanowire structures thereon to enhance light extraction efficiency. In addition, a phosphor film is applied on the nanowire structures. This suppresses waveguide effects exhibited in the general phosphor layer structure, thereby preventing degradation of light efficiency. Therefore, the present invention provides advantages of both of the phosphor film and the nanostructures.

Furthermore, the present invention employs a thin film structure phosphor, which not only facilitates a manufacturing process but also provides advantages (improved surface adhesion, structural and thermal stability, uniform surface and the like) of the thin phosphor film. Further, the present invention achieves miniaturization and high integration of a semiconductor device by employing a nanostructure.

While the present invention has been shown and described in connection with the exemplary embodiments, it will be apparent to those skilled in the art that modifications and variations may be made without departing from the spirit and scope of the invention as defined by the appended claims.

What is claimed is:

1. A semiconductor light emitting device comprising:
   a substrate;
   a light emitting structure comprising a first conductivity type semiconductor layer, an active layer and a second conductivity type semiconductor layer sequentially formed on the substrate;
   a plurality of nanowire structures formed on the light emitting structure and formed of a transparent material; and
   a phosphor film formed on at least an upper surface and a side surface of each of the plurality of nanowire structures,
   wherein the phosphor film is additionally formed on the entire area of upper surfaces of the light emitting structure exposed between the plurality of nanowire structures.

2. The semiconductor light emitting device of claim 1, wherein the plurality of nanowire structures are formed of one selected from a group consisting of $Zn_xMg_{1-x}O$ ($0 \leq x \leq 1$) and $Al_xIn_yGa_{1-x}N$ ($0 \leq x$ and $y \leq 1$).

3. The semiconductor light emitting device of claim 1, wherein the plurality of nanowire structures are separated at an interval of 2 to 100 nm.

4. The semiconductor light emitting device of claim 1, wherein the plurality of nanowire structures are formed of a transparent conductive oxide.

5. The semiconductor light emitting device of claim 4, wherein the transparent conductive oxide is an oxide of at least one element selected from a group consisting of In, Sn, Zn, Ga, Cd, Mg, Be, Ag, Mo, V, Cu, Ir, Rh, Ru, W, Co, Ni, Mn and La.

6. A semiconductor light emitting device comprising;
   a substrate;
   a light emitting structure comprising a first conductivity type semiconductor layer, an active layer and a second conductivity type semiconductor layer sequentially formed on the substrate;
   a plurality of nanowire structures formed on the light emitting structure and formed of a transparent material; and
   a phosphor film formed on at least an upper surface and a side surface of each of the plurality of nanowire structures,
   wherein the substrate has electric conductivity,
   the semiconductor light emitting device further comprising first and second electrodes formed on a bottom of the substrate and a top of the second conductivity type semiconductor layer, respectively.

7. The semiconductor light emitting device of claim 6, wherein the phosphor film is additionally formed on upper surfaces of the light emitting structure between the plurality of nanowire structures.

* * * * *